(12) United States Patent
Seo

(10) Patent No.: US 6,380,607 B2
(45) Date of Patent: *Apr. 30, 2002

(54) SEMICONDUCTOR DEVICE AND METHOD FOR REDUCING PARASITIC CAPACITANCE BETWEEN DATA LINES

(75) Inventor: Won Cheul Seo, Seoul (KR)

(73) Assignee: LG Semicon Co., Ltd., Chungcheongbuk-Do (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/216,874

(22) Filed: Dec. 21, 1998

(30) Foreign Application Priority Data

Dec. 31, 1997 (KR) .......................... 1997/80698
Jul. 28, 1998 (KR) .......................... 1998/30314

(51) Int. Cl.[7] .............................................. H01L 29/00
(52) U.S. Cl. ...................................... 257/522; 257/752
(58) Field of Search ........................... 257/386, 522, 257/752, 758

(56) References Cited

U.S. PATENT DOCUMENTS

| | | | | | |
|---|---|---|---|---|---|
| 5,416,355 | A | * | 5/1995 | Kudoh | 257/758 |
| 5,512,775 | A | * | 4/1996 | Cho | 257/522 |
| 5,668,398 | A | * | 9/1997 | Havemann et al. | 257/522 |
| 5,691,573 | A | * | 11/1997 | Avanzino et al. | 257/752 |
| 5,814,888 | A | * | 9/1998 | Nishioka et al. | 257/522 |
| 5,835,987 | A | * | 11/1998 | Givens | 257/522 |
| 5,856,703 | A | * | 1/1999 | Manning | 257/522 |
| 5,861,674 | A | * | 1/1999 | Ishikawa | 257/758 |
| 5,872,401 | A | * | 2/1999 | Huff et al. | 257/752 |
| 5,990,557 | A | * | 11/1999 | Avanzino et al. | 257/752 |

* cited by examiner

Primary Examiner—Gene M. Munson
(74) Attorney, Agent, or Firm—Morgan, Lewis & Bockius LLP

(57) ABSTRACT

A wire in a semiconductor device and the fabricating the same are disclosed in the present invention. A semiconductor device includes a semiconductor substrate, a plurality of conductive layers on the semiconductor substrate, and an insulating layer on the semiconductor substrate including the conductive layers, the insulating layer having at least one void between each adjacent conductive layer.

4 Claims, 9 Drawing Sheets

US 6,380,607 B2

SEMICONDUCTOR DEVICE AND METHOD FOR REDUCING PARASITIC CAPACITANCE BETWEEN DATA LINES

This application claims the benefit of Korean Applications No. 97-80698 filed Dec. 31, 1997, and No. 98-30314 filed Jul. 28, 1998, which is hereby incorporated by reference.

BACKGROUND OF THE INVENTION

1. Field of the Invention

The present invention relates to a semiconductor device, and more particularly, to a semiconductor device and a method of fabricating the same. Although the present invention is suitable for a wide scope of applications, it is particularly suitable for reducing a parasitic capacitance between data lines. Accordingly, a DRAM (Dynamic Random Access Memory) device having a stable performance and an improved data sensing capability is fabricated in the present invention.

2. Discussion of the Related Art

In a semiconductor device, aluminum is a choice of material for interconnection between gate electrodes, source/drain regions, and electrical contacts.

Generally, a wiring characteristic is deteriorated with a reduction in a device dimension or a power source. For example, in a gate electrode, a signal transmission is delayed due to a resistance increase. An operation speed is thus decreased. Also, a current intensity of an electrical contact is increased due to the resistance increase, thereby degrading a reliability of a wiring in the device. As a result, the increases in resistance and the current intensity cause an electromigration, which significantly degrades the reliability of the wiring in the device. Particularly in submicron devices, a RC (resistance-capacitance) transmission is delayed because a wiring resistance and a capacitance are increased due to micronization and reduction in a wiring pitch.

A metal wiring in a semiconductor device according to a background art will be explained with reference to the attached drawings. FIG. 1 is a cross-sectional view illustrating the background art semiconductor device. FIGS. 2A to 2E are cross-sectional views showing the process steps of fabricating method of the background art semiconductor device. FIG. 3 is a circuit diagram of the background art semiconductor device.

In the DRAM, wordlines applying driving signals to cell transistors and bitlines applying data signals to cell capacitors are arranged to cross each other to have a higher integration. The background art semiconductor device will be explained with an emphasis on a conductive layer pattern (bitline).

Initially referring to FIG. 1, the background art semiconductor device is provided with a conductive layer pattern 12 on a semiconductor substrate 10 having cell transistors. The conductive layer pattern 12 is connected to source/drain of the cell transistors or another conductive layers. A second insulating layer 13 is formed on the semiconductor substrate 10 including the conductive layer pattern 12, and a third insulating layer 14 for planarizing the device. At first insulating layer 11, such as oxide, is provided between the conductive layer pattern 12 and the semiconductor substrate 10 for insulating the conductive pattern 12 from other regions.

A method of forming the aforementioned background art semiconductor device will be explained as follows.

Initially referring to FIG. 2A, an insulating layer 11a is formed on a semiconductor substrate 10 having cell transistors or another conductive layers formed thereon. A conductive layer 12a is formed on the insulating layer 11a for a metal line.

As shown in FIG. 2B, the conductive layer 12a and the insulating layer 11a are selectively etched to form a conductive layer pattern 12 and a first insulating layer pattern 11, respectively.

In FIG. 2C, a second insulating layer 13, such as oxide, is formed on the semiconductor substrate 10 including the conductive layer pattern 12 and the first insulating layer 11.

A layer 14a having a good insulating characteristic and a fluidity, such as an SOG (spin on glass) layer, is formed over the semiconductor substrate in FIG. 2D. In this process, the layer 14a is formed to completely fill the spaces between each conductive layer pattern 12 on the second insulating layer 13.

Thereafter, the layer 14a is subjected to an anisotropic etching to expose an upper surface of the second insulating layer 13, thereby completing a semiconductor device having a third insulating layer 14, as shown in FIG. 2E.

However, the semiconductor device fabricated by the aforementioned method has a parasitic capacitance Cb between the second and third insulating layers 13 and 14. Generally, the second and third insulating layers 13 and 14, such as oxide, have a dielectric constant of about 3.85.

A reading operation of the background art semiconductor device will be explained with reference to FIG. 3.

A unit cell of a DRAM is provided with a cell transistor T1, a cell capacitor Cs having one electrode connected to a ground terminal and another electrode connected to one of electrodes of source/drain in the cell transistor T1. An S/A (sensing amplifier) for sensing and amplifying data in the cell through a bitline BL connected to one of the electrode of the source/drain in the cell transistor T1 to output signals. As shown in FIG. 3, the aforementioned unit cell generates a parasitic capacitance Cb (bitline parasitic capacitance) during reading operation in the second and third insulating layers 13 and 14 between one side of the cell transistor T1 and the S/A.

In reading data from the DRAM, when a voltage is applied to a wordline W/L through a gate of the cell transistor T1 after a Vd/2 is precharged to the bitline B/L, the Vd/2 is also applied to the parasitic capacitance Cb. Upon applying the voltage to the wordline W/L to turn on the cell transistor T1, a charge in the cell capacitor Cs changes a voltage of the bitline B/L by $Vs=(Vd/2)/(1+Cb/Cs)$. Thereafter, the sensing amplifier S/A compares voltages of the bitline B/L and a bitbarline $\overline{B/L}$ to output the compared value after amplifying the value. Vd, Cb, and Cs denote a voltage of a power source, a parasitic capacitance of the bitline, and a capacitance of the cell capacitor $C_1$, respectively.

In order to have the Vs at least higher than 100 mV, both the Vd and the Cs should be increased, while the Cb should be decreased. However, there is a maximum value for Vd due to limitations in a transistor size and a low power consumption. Therefore, by reducing the Cb value, a data sensing capability can be much improved in the device. For instance, a dielectric constant of the second and third insulating layers 13 and 14, such as oxide, between the conductive layer patterns 12 (bitlines) in the background art is about 3.85. The parasitic capacitance Cb may be represented as $(\epsilon S)/d$, where $\epsilon$ is a dielectric constant of oxide, S is an area of the bitline, and d is a distance between the bitlines, respectively. Accordingly, the parasitic capacitance in the background art may be represented as Cb=(3.85×S)/d.

In a wiring in a semiconductor device according to the background art, a parasitic capacitance by the oxide layer between bitlines degrades a data sensing capability of the device. Since the parasitic capacitance is generated from a dielectric constant of oxide itself, it can be reduced by increasing both the source power voltage Vd and the capacitance of the cell capacitor Cs.

However, an increase in the source power voltage Vd is limited by size of the device and power consumption. Also, an increase in a cell capacitance is problematic because a fabricating process becomes complicated. Further, a reduction of the parasitic capacitance Cb is also practically impossible because of a dielectric constant of oxide.

SUMMARY OF THE INVENTION

Accordingly, the present invention is directed to a semiconductor device and a method of fabricating the same that substantially obviates one or more of the problems due to limitations and disadvantages of the related art.

An object of the present invention is to provide a wiring in a semiconductor device and a method of fabricating the same, in which a parasitic capacitance between conductive patterns is reduced for providing a stable operation of the device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a wiring in a semiconductor device includes a semiconductor substrate, a plurality of conductive layer patterns on the semiconductor substrate, an insulating film on the semiconductor substrate and the conductive layer pattern, and at least one void in the insulating film between the conductive layer patterns adjacent to each other.

In another aspect of the present invention, there is provide a method for fabricating a wiring in a semiconductor device includes the steps of providing a semiconductor substrate, forming a plurality of conductive layer patterns on the semiconductor substrate, and forming an insulating film having at least one void therein on the semiconductor substrate and the conductive layer pattern and between the conductive layer patterns adjacent to each other.

In another aspect of the present invention, a semiconductor device includes a semiconductor substrate, a plurality of conductive layers on the semiconductor substrate, and an insulating layer on the semiconductor substrate including the conductive layers, the insulating layer having at least one void between each adjacent conductive layer.

In another aspect of the present invention, a method of fabricating a semiconductor device having a semiconductor substrate includes the steps of forming a plurality of conductive layers on the semiconductor substrate, and forming an insulating layer on the semiconductor substrate including the conductive layers, the insulating layer having at least one void between each adjacent conductive layer.

In a further aspect of the present invention, a method of fabricating a semiconductor device having a semiconductor substrate includes the steps of forming a plurality of conductive layers on the semiconductor substrate, forming an insulating layer on the semiconductor substrate including the conductive layers, forming a nitride layer on the insulating layer, forming an insulating interlayer on the nitride layer, removing the insulating interlayer to expose an upper surface of the nitride layer, forming a hemi-spherical grain silicon layer on the insulating interlayer including the upper surface of the nitride layer, selectively removing the insulating interlayer using the hemi-spherical grain silicon layer as a mask to form a plurality of void in the insulating interlayer, and forming a planarization layer on the insulating interlayer including the nitride layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
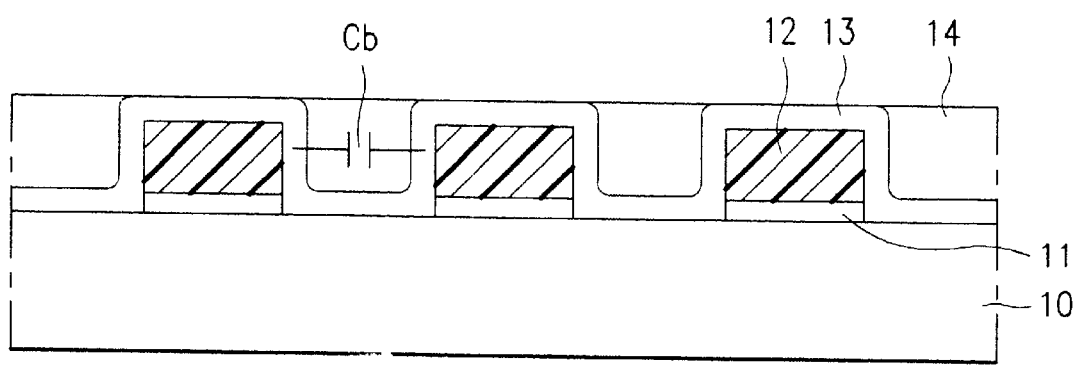
FIG. 1 is a cross-sectional view illustrating a semiconductor device in accordance with a background art.
Figure 2A:
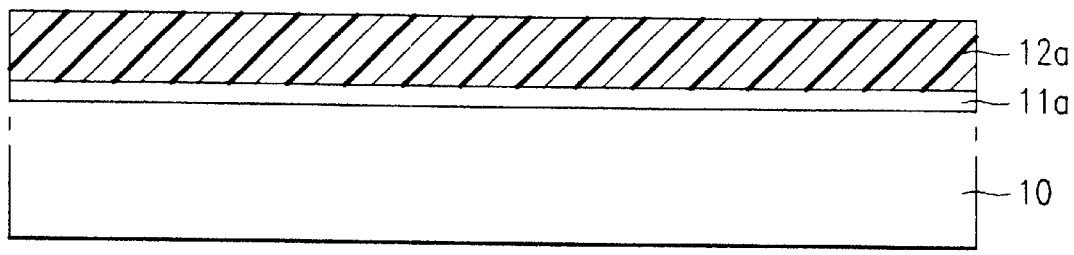
FIGS. 2A to 2E are cross-sectional views showing the process steps of fabricating method of the background art semiconductor device.
Figure 2B:
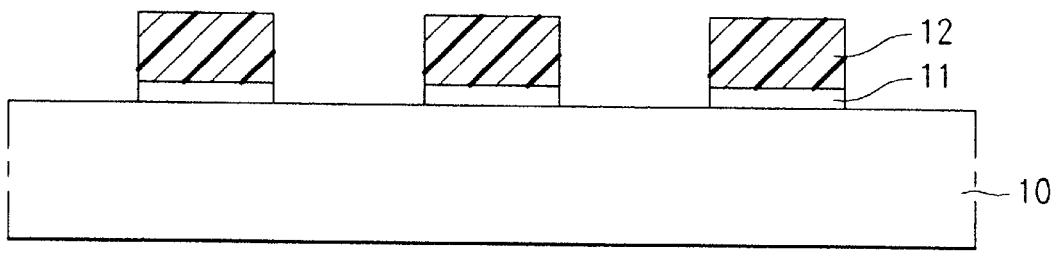
Figure 2C:
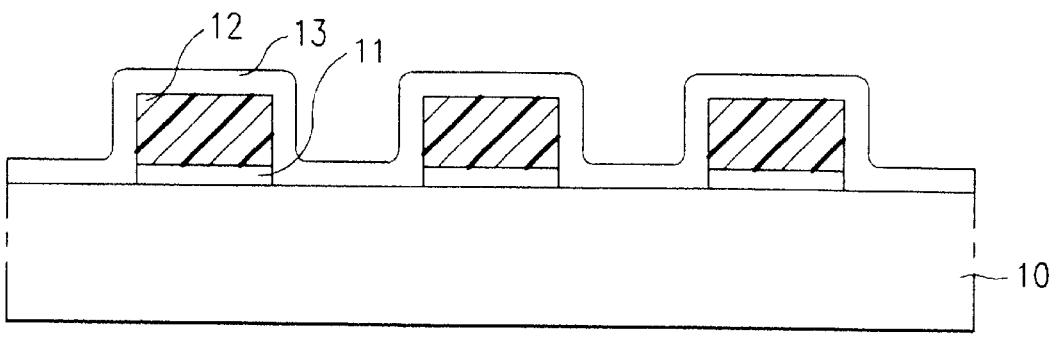
Figure 2D:
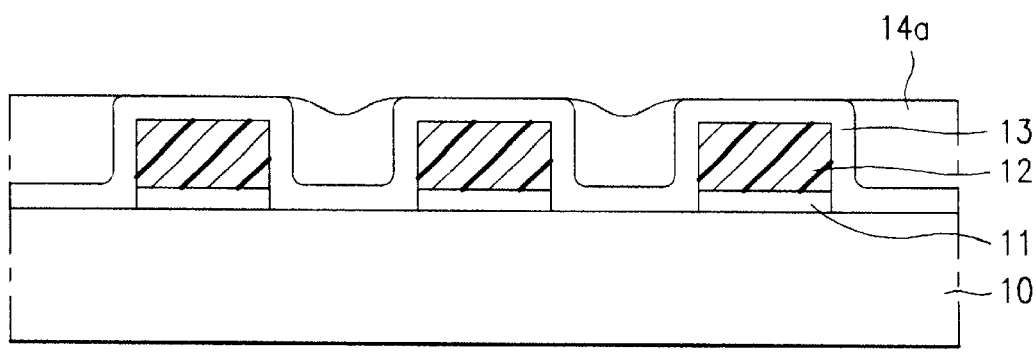
Figure 2E:
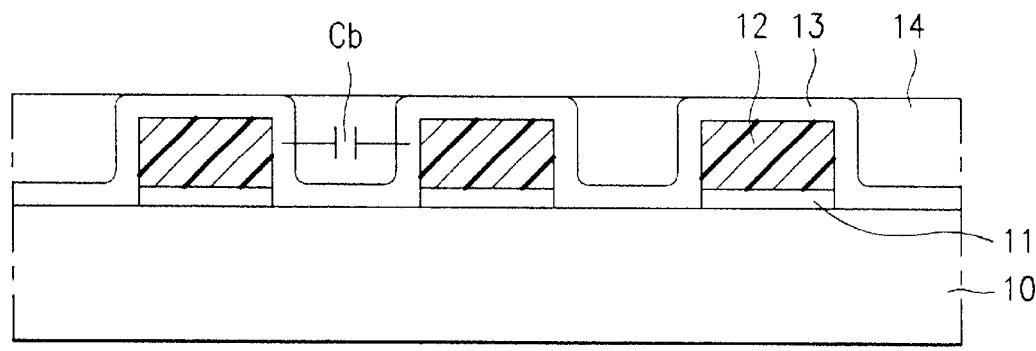
Figure 3:
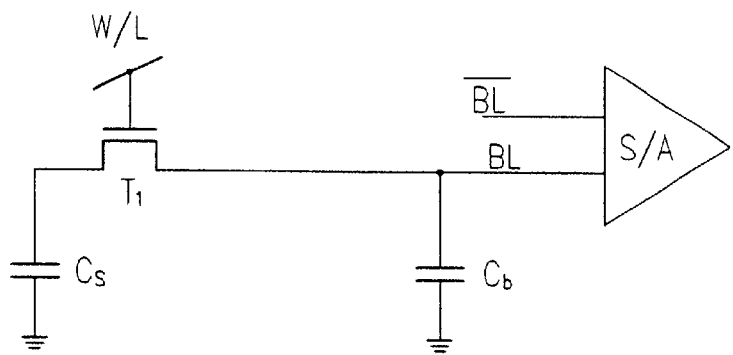
FIG. 3 is an equivalent circuit diagram of the background art semiconductor device during a reading operation.
Figure 4:
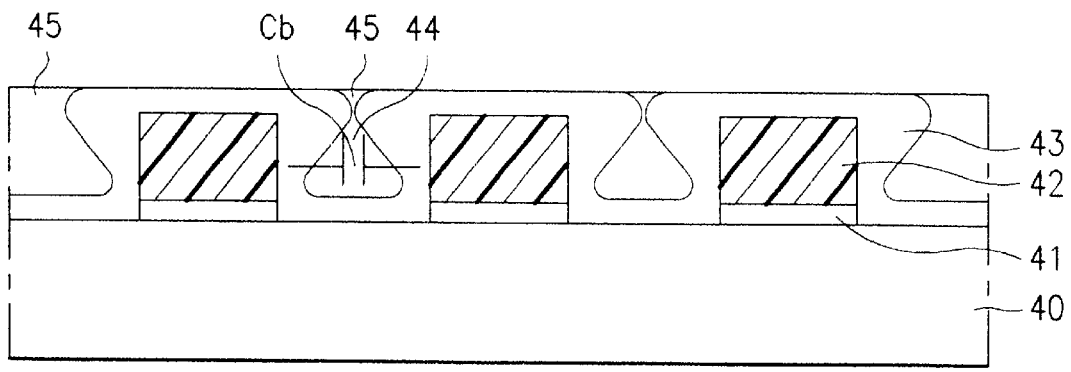
FIG. 4 is a cross-sectional view of a semiconductor device in accordance with a first embodiment of the present invention.

Reference will now be made in detail to the preferred embodiments of the present invention, examples of which are illustrated in the accompanying drawings. FIG. 4 is a cross-sectional view of a semiconductor device in accordance with a first embodiment of the present invention while FIGS. 5A to 5E are cross-sectional views showing the process steps of fabricating method of the semiconductor device in accordance with the first embodiment of the present invention.

A parasitic capacitance generated in the insulating layers between conductive lines is suppressed in the semiconductor device of the present invention. The parasitic capacitance in the semiconductor device of the present invention is much more reduced by lowering a dielectric constant itself than that of the background art semiconductor where insulating layer are filled in the spaces between conductive line patterns. Now, a semiconductor device according to a first embodiment of the present invention will be explained as follows.

Referring to FIG. 4, a semiconductor device in accordance with the first embodiment of the present invention includes a first insulating film 41 on a semiconductor substrate 40 having cell transistors. A conductive layer pattern 42 is formed on the first insulating film 41. A second insulating film 43 is formed on the semiconductor substrate 40 including the conductive layer pattern 42. The second insulating film 43 has overhangs between the conductive layer patterns 42 to form a void 44 below the overhangs. A third insulating film 45 is formed on the second insulating film 43 to planarize the semiconductor device. The void 44 formed in the second insulating film 43 between the conductive layer patterns 42 below the overhangs is filled with air.

A method of fabricating the semiconductor device having the aforementioned wiring in accordance with the first embodiment of the present invention will be explained with reference with the attached drawings.

Figure 5A:
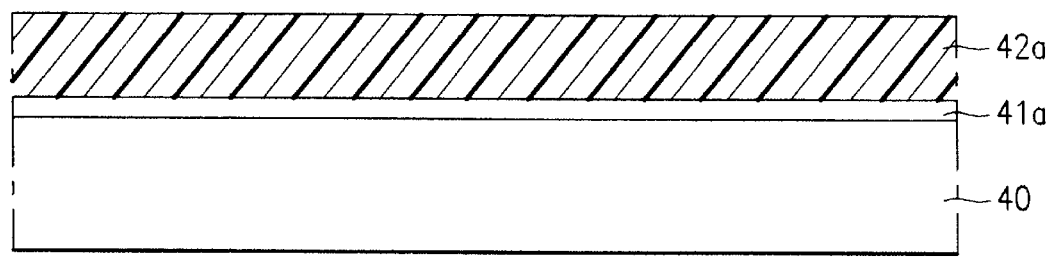
FIGS. 5A to 5E are cross-sectional views showing the process steps of fabricating method of a semiconductor device in accordance with the first embodiment of the present invention.

Initially referring to FIG. 5A, an insulating material layer 41a is formed on an semiconductor substrate 40 having cell transistors and other conductive layers. Then, a conductive material layer 42a (a bitline in a DRAM) for a metal line is formed on the insulating material layer 41a.

Figure 5B:
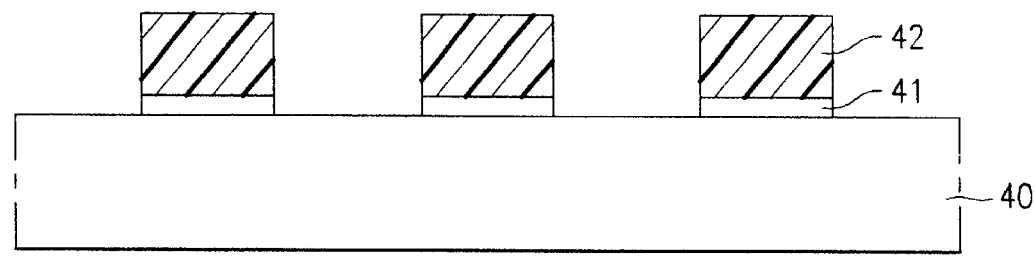

As shown in FIG. 5B, the conductive material layer 42a and the insulating material layer 41a are subjected to selective etching to form a conductive layer pattern 42 and a first insulating film 41.

Figure 5C:
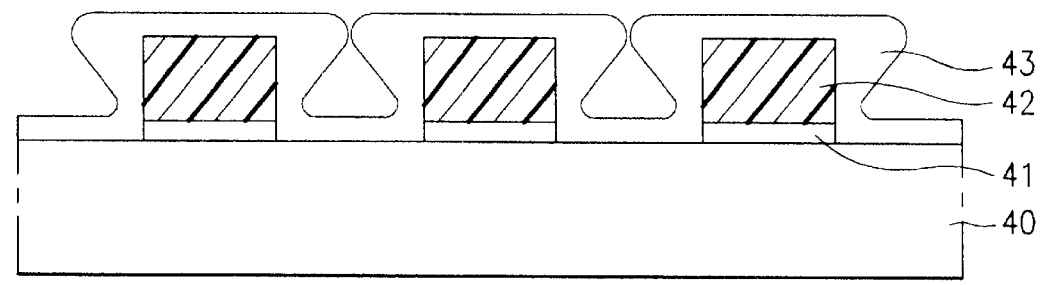

Thereafter, a second insulating film 43, such as oxide, is formed on the semiconductor substrate 40 having the conductive layer pattern 42 including the first insulating film 41, as shown in FIG. 5C. In this process, the second insulating film 43 is formed to have overhangs between the adjacent conductive layer patterns, thereby forming a void 44 below the overhangs. Air is naturally trapped in the void 44.

In the process of forming the second insulating film 43, an oxide film is formed by a delta-$N_2O$ process to have a poor side step coverage. Generally, the delta-$N_2O$ process is used for improving a flatness of an interlayer insulating film for a device with a dimension below 0.35 $\mu$m. By using the delta-$N_2O$ process, an insulating film with overhangs is formed, so that the side step coverages of metal lines become poor. The spaces between the metal lines are filled with a material having an excellent fluidity, such as SOG. The process is used mostly in improving a flatness by preventing formation of recesses in the SOG layer in the middle of metal wiring when the metal wiring has a large gap. The delta-$N_2O$ process is an oxide film formation process by a thermal decomposition using TEOS (Tetra-Ethyl-Ortho-Silicate)/$O_2$/$N_2O$ in stead of TEOS/$O_2$ for forming an oxide film on the wiring lines. When an oxide film is formed by thermal decomposition using TEOS/$O_2$/$N_2O$, the overhangs are prone to be formed at the upper portion of the hole due to a poor side step coverage created by $N_2O$ gas. In the first embodiment of the present invention, because of the overhangs at the upper portion of the hole, a void 44 is formed in the second insulating film 43 and air having a dielectric constant 1 is trapped in the void 44.

Figure 5D:
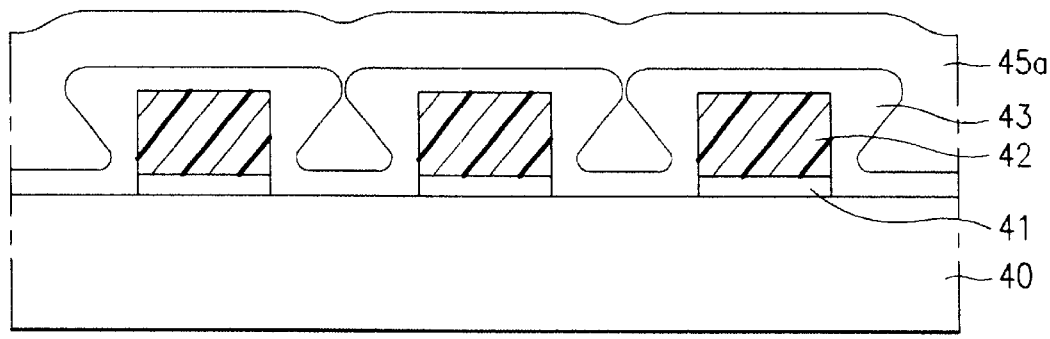

After forming the second insulating film 43 with a void 44, as shown in FIG. 5D, a third insulating material layer 45a is formed on the surface over the semiconductor substrate 40 to an enough thickness to fill the spaces between the conductive lines 42.

Figure 5E:
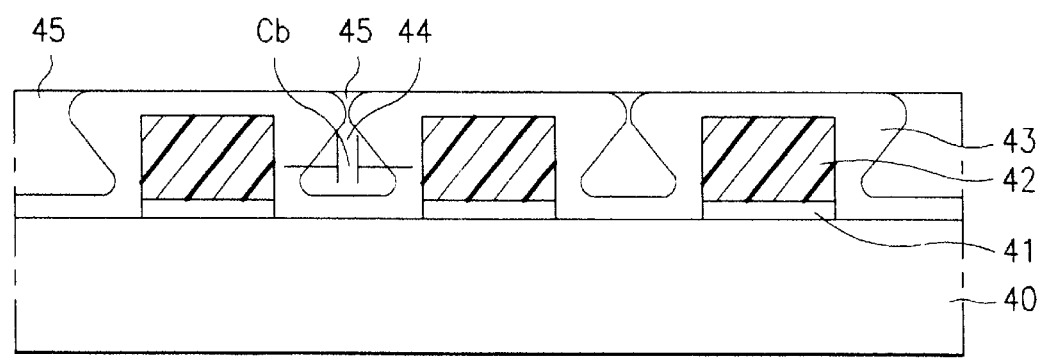

In FIG. 5E, the third insulating material layer 45a is subjected to anisotropic etching, so that the third insulating material layer 45a remains only on the recesses of the second insulating film 43 to form a third insulating film 45, thereby planarizing the semiconductor device. The third insulating material layer 45a are mainly formed on the overhung portions of the second insulating film 43. Alternatively, a tilt deposition process instead of the delta-$N_2O$ process may be used in forming the second insulating film 43.

Figure 6:
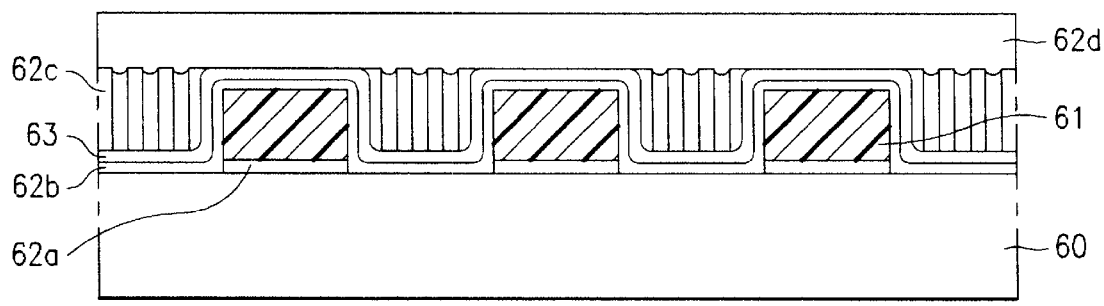
FIG. 6 is a cross-sectional view of a semiconductor device in accordance with a second embodiment of the present invention.

A second embodiment of the present invention will be described with reference to the attached drawings. FIG. 6 illustrates a cross-sectional view of a semiconductor device in accordance with a second embodiment of the present invention. FIGS. 7A to 7F are cross-sectional views showing the process steps of fabricating method for a semiconductor device in accordance with the second preferred embodiment of the present invention. In the second embodiment, a HSG (hemi-spherical grain) process is used to form a void filled with air in an insulating film between the conductive layer patterns.

Initially referring to FIG. 6, the semiconductor device in accordance with the second embodiment of the present invention includes a first oxide film 62a formed on a semiconductor substrate 60 having cell transistors. A conductive layer pattern 61 is formed on the first oxide film 62a. A second oxide film 62b and a nitride film 63 formed in this order on the conductive layer pattern 61 including the semiconductor substrate 60. A third oxide film 62c having a plurality of vertical pass-through voids 65 between the conductive layer patterns 61 are formed on the nitride film 63a except for the top surface. A fourth oxide film 62d formed on the entire surface including the third oxide film 62c for planarizing the device.

The vertical pass-through holes in the third oxide film 62c are formed to have irregular sizes and positions. The holes are sealed by the nitride film 63 at the lower side of the holes and the fourth oxide film 62d at the upper side. The inside of the holes is naturally filled with air. The voids 65 has a diameter in the range of 250 to 1000 Å.

A method of fabricating the semiconductor device in accordance with the second embodiment of the present invention will be described as follows.

Figure 7A:
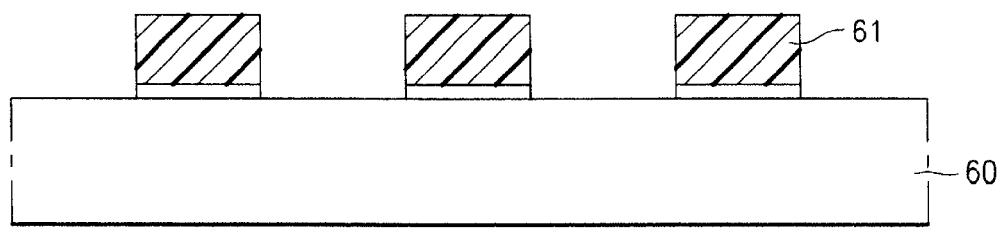
FIGS. 7A to 7F are cross-sectional views showing the process steps of fabricating method of a semiconductor device in accordance with the second embodiment of the present invention.

Referring to FIG. 7A, a first oxide film 62a is initially formed on a semiconductor substrate 60 having cell transistors or other conductive layers. A conductive material layer (bitline in a DRAM) for a metal line is then formed on the first oxide film 62a. The conductive material layer and the first oxide film 62a are subjected to selective etching to form a conductive layer pattern 61.

Figure 7B:
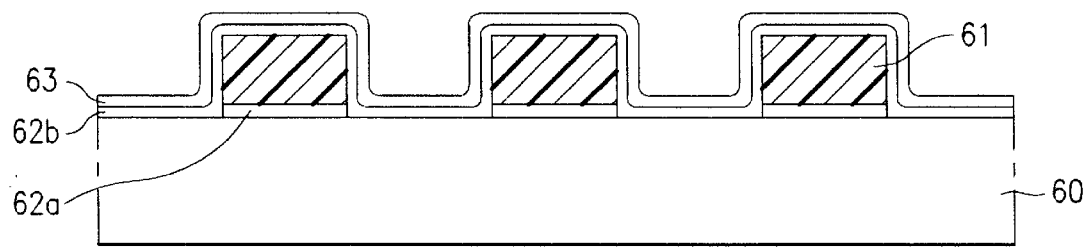

As shown in FIG. 7B, a second oxide film 62b and a nitride film 63 are successively formed on the semiconductor substrate 60 including the conductive layer pattern 61 and the first oxide film 62a.

Figure 7C:
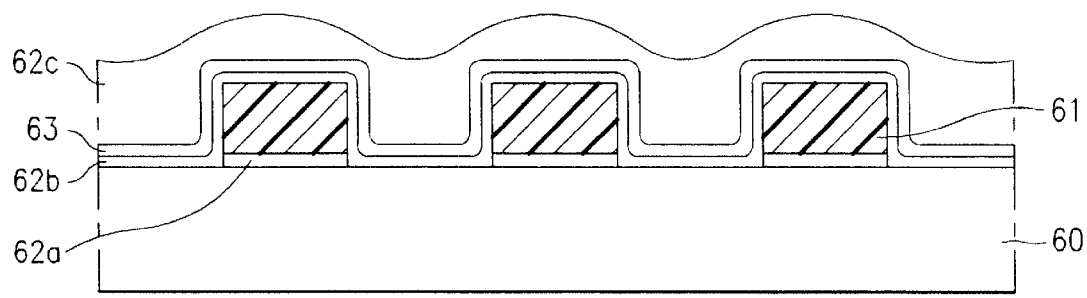

FIG. 7C shows that a third oxide film 62c is formed on the nitride film 63 including the conductive layer pattern 61 to have an enough thickness to fill the gap between the adjacent conductive layer patterns 61.

Figure 7D:
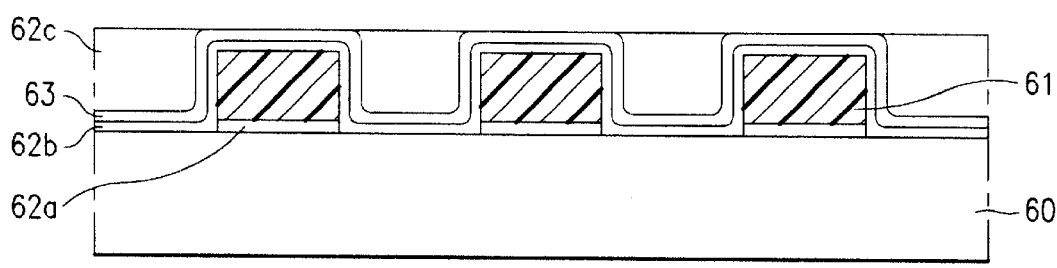

Thereafter, the third oxide film 62c is subjected to anisotropic etching to expose an upper surface of the nitride film 63 on the conductive layer pattern 61. Thus, the third oxide film 62c between the conductive layer patterns 61 is planarized, as shown in FIG. 7D.

Figure 7E:
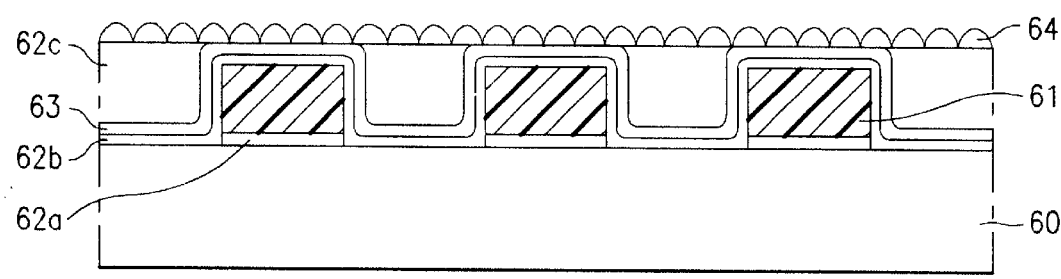

As shown in FIG. 7E, a HSG silicon layer 64 is formed on the planarized surface at about 550 to 600° C. to have a thickness of 500~2000 Å.

Figure 7F:
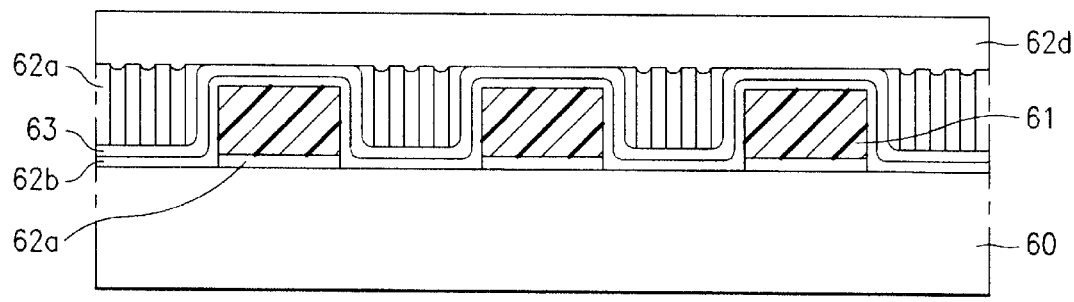

The entire surface of the HSG silicon layer 64 is subjected to anisotropic etching in FIG. 7F. The HSG silicon layer 64, which has irregular size hemispheres and scattered irregularly, is used as a mask in the anisotropic etching. The third oxide film 62c is etched only at the portions corresponding to the recessed portions of the HSG silicon layer 64 due to different etching rates between the convex portions and the recessed portions of the HSG silicon layer 64. The nitride film 63 acts as an etch stop detection point in the etching process. Accordingly, the third oxide film 62c is vertically etched until the nitride film 63 is exposed, thereby forming a plurality of holes through the third oxide film 62c.

As shown FIG. 7F, a fourth oxide film 62d is formed on the entire surface by chemical vapor deposition to seal the holes in the third oxide film 62c. Thus, voids 65 filled with air are formed in the insulating layer between the conductive layer patterns 61, surrounded by the nitride film 63, the third oxide film 62c with holes, and the fourth oxide film 62d. The voids 65 have a diameter in the range of 250 to 1000 Å.

A parasitic capacitance of the semiconductor device in the present invention can be expressed as Cb=S/d because the dielectric constant of air is unity (where Cb=($\epsilon$S)/d,, $\epsilon$=1). When the spaces between the conductive pattern layers are filled with the oxide film, a parasitic capacitance is Cb=(3.85S)/d because the dielectric constant of the oxide is 3.85. Setting that parasitic capacitances of the present invention and the background art are Cb' and Cb, respectively, and signal voltages of the present invention and the background art are Vs'=(Vd/2)/(1+Cb'/Cs) and Vs=(Vd/2)/(1+Cb/Cs), $$\frac{Vs}{Vs'} = \left(\frac{1+Cb/Cs}{1+Cb'/Cs}\right)^{-1} = \left(\frac{Cs+Cb}{Cs+Cb'}\right)^{-1} \approx \left(\frac{Cb}{Cb'}\right)^{-1}$$

Where, Cb=3.85 and Cb'=1, the signal voltage of the present invention Vs' has a value 3.85 times greater than the signal value of the background art Vs. As a result, a sensing capability of the present invention is improved as a shown result.

A wiring in a semiconductor device and a method of fabricating the same in the present invention has the following advantages.

By forming the insulating film having a void in the data line, a parasitic capacitance Cb is much reduced, thereby improving a data sensing capability without increasing a source power voltage Vd and cell capacitance Cs.

In addition, the semiconductor device in the present invention can be operated with a cell capacitor a few times smaller than a current semiconductor device with a cell capacitor due to a reduced parasitic capacitance.

Further, steps or chip size of the semiconductor device is decrease, so that a higher integration is achieved in the present invention.

It will be apparent to those skilled in the art that various modifications and variations can be made in the wiring in a semiconductor device and a method for fabricating the same of the present invention without departing from the spirit or scope of the invention. Thus, it is intended that the present invention cover the modifications and variations of this invention provided they come within the scope of the appended claims and their equivalents.

What is claimed is:

1. A semiconductor device comprising:
   a semiconductor substrate;
   a plurality of first insulating layers spaced apart from each other and directly contacting the semiconductor substrate, each of the plurality of first insulating layers having a top surface and side surfaces;
   a conductive layer formed only on the top surface of each of the plurality of first insulating layers, wherein each of the plurality of first insulating layers and the conductive layer form a plurality of consecutive conductive layer patterns;
   a second insulating layer formed on the semiconductor substrate, and on the plurality of consecutive conductive layer patterns;
   a nitride layer formed on the second insulating layer; and
   a third insulating layer formed between each of the consecutive conductive layer patterns, wherein the third insulating layer includes a plurality of substantially vertical pass-through voids between each of the consecutive conductive layers.

2. The device according to claim 1, wherein the plurality of substantially vertical pass-through voids have a columnar shape perpendicular to the semiconductor substrate.

3. The device according to claim 2, wherein the voids have a diameter in the range of 250 to 1000 Å.

4. The device according to claim 1, wherein the first, second and third insulating layers are oxides.

* * * * *